(12) United States Patent
Ke et al.

(10) Patent No.: US 10,868,536 B1
(45) Date of Patent: Dec. 15, 2020

(54) HIGH COMMON-MODE TRANSIENT IMMUNITY HIGH VOLTAGE LEVEL SHIFTER

(71) Applicant: Analog Devices International Unlimited Company, Limerick (IE)

(72) Inventors: Xugang Ke, Santa Clara, CA (US); Min Chen, Fremont, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/577,556

(22) Filed: Sep. 20, 2019

(51) Int. Cl.
*H03K 19/0185* (2006.01)
*H03K 17/16* (2006.01)
*H03K 3/0233* (2006.01)
*H02M 1/12* (2006.01)

(52) U.S. Cl.
CPC ... *H03K 19/018514* (2013.01); *H03K 17/162* (2013.01); *H03K 19/018507* (2013.01); *H03K 19/018521* (2013.01); *H03K 19/018528* (2013.01); *H02M 2001/123* (2013.01); *H03K 3/02335* (2013.01)

(58) Field of Classification Search
CPC ........ H03K 17/162; H03K 19/018528; H03K 19/018521; H03K 19/018514; H03K 19/018507; H02M 2001/123
See application file for complete search history.

(56) References Cited

U.S. PATENT DOCUMENTS

| | | | |
|---|---|---|---|
| 5,148,118 A | 9/1992 | Dobkin et al. | |
| 6,611,154 B2 * | 8/2003 | Grasso | H03K 19/00361 326/31 |
| 6,920,570 B2 | 7/2005 | Fujimoto et al. | |
| 7,212,033 B2 | 5/2007 | Subramania et al. | |
| 7,307,462 B2 * | 12/2007 | Cheng | H02M 1/096 327/108 |
| 7,432,745 B2 * | 10/2008 | Hwang | H03K 17/063 327/108 |
| 7,782,115 B2 | 8/2010 | Ochi | |

(Continued)

FOREIGN PATENT DOCUMENTS

| | | |
|---|---|---|
| CN | 107947774 A | 4/2018 |
| CN | 108288963 A | 7/2018 |
| CN | 109905111 A | 6/2019 |

OTHER PUBLICATIONS

Abdelmoaty, Ahmed, et al., "A High-Voltage Level Shifter with Sub-Nano-Second Propagation Delay for Switching Power Converters", IEEE Applied Power Electronics Conference and Exposition (APEC), (2016), 4 pgs.

(Continued)

*Primary Examiner* — Thomas J. Hiltunen

(74) *Attorney, Agent, or Firm* — Schwegman Lundberg & Woessner, P.A.

(57) ABSTRACT

A high-voltage level shifter circuit that is capable of level shifting a signal from a low-voltage rail to a high-voltage rail for effective gate driving of a top power switch, with a short propagation delay and a high common-mode transient immunity (CMTI). The high CMTI high-voltage level shifter circuit can include a differential input and isolation stage, a high dv/dt sensor and cancellation stage, at least one differential and common-mode gain stage, and an output buffer stage.

21 Claims, 6 Drawing Sheets

(56) References Cited

U.S. PATENT DOCUMENTS

| | | | | |
|---|---|---|---|---|
| 7,893,730 | B2* | 2/2011 | Jung | H03K 19/01852 327/108 |
| 8,044,699 | B1 | 10/2011 | Kelly | |
| 8,217,703 | B2 | 7/2012 | Hurrell | |
| 8,598,936 | B2* | 12/2013 | Kuge | H03K 19/00369 326/52 |
| 8,633,745 | B1* | 1/2014 | Peterson | H03K 17/08104 327/156 |
| 8,779,806 | B2 | 7/2014 | Tseng et al. | |
| 8,896,377 | B1 | 11/2014 | Shrestha | |
| 8,933,714 | B2* | 1/2015 | Akahane | H03K 17/56 324/705 |
| 9,264,022 | B2* | 2/2016 | Kihara | H03K 3/356 |
| 9,577,616 | B2 | 2/2017 | Moore et al. | |
| 9,660,651 | B2* | 5/2017 | Honda | H03K 19/01852 |
| 9,722,610 | B2* | 8/2017 | Akahane | H03K 3/012 |
| 10,116,301 | B2* | 10/2018 | Fesler | H03K 17/687 |
| 10,135,275 | B2 | 11/2018 | Kinzer et al. | |
| 10,171,082 | B2* | 1/2019 | Akahane | H03K 17/16 |
| 10,230,372 | B2 | 3/2019 | Zhu et al. | |
| 10,333,408 | B1* | 6/2019 | Knoedgen | H02M 3/1584 |
| 10,483,977 | B1* | 11/2019 | Berwick | H03K 19/01852 |
| 2012/0229165 | A1* | 9/2012 | Tseng | H03K 19/00361 326/82 |
| 2017/0201399 | A1 | 7/2017 | Adinarayana et al. | |
| 2018/0302072 | A1 | 10/2018 | Abesingha et al. | |
| 2018/0358968 | A1 | 12/2018 | Schemm | |

OTHER PUBLICATIONS

Hackel, Jonathan, et al., "Capacitive Gate Drive Signal Transmission with Transient Immunity up to 300 \V/ns", ITG-Fachbericht 266: Analog 2016, 12, Bremen, (Sep. 14, 2016), 5 pgs.

Ke, Xugang, et al., "A 3-to-40V V(IN) 10-to-50MHz Isolated GaN Driver with Self-Excited t(dead) Minimizer Achieving 0.2ns/0.3ns t(dead), 7,9 Percent Minimum Duty Ratio and 50V/ns CMTI", ISSCC Session 24, GaN Drivers and Converters, 24.3, (2018), 3 pgs.

Ke, Xugang, et al., "A Tri-Slope Gate Driving GaN DC-DC Converter With Spurious Noise Compression and Ringing Suppression for Automotive Applications", IEEE Journal of Solid-State Circuits, 53(1), (Jan. 2018), 14 pgs.

Liu, Dawei, et al., "A New Design Technique for Sub-Nanosecond Delay and 200 V/ns Power Supply Slew-Tolerant Floating Voltage Level Shifters for GaN SMPS", IEEE Transactions on Circuits and Systems—1: Regular Papers, 66(3), (Mar. 2019), 11 pgs.

Liu, Zhidong, et al., "Design of On-Chip Drivers With Power-Efficient High-Speed Level Shifting and Dynamic Timing Control for High-Voltage Synchronouc Switching Power Converters", IEEE Journal of Solid-State Circuits, 50(6), (Jun. 2015), 15 pgs.

Salimath, A., et al., "A High-Speed Level Shifting Technique and its Application in High-Voltage, Synchronous DC-DC Converters with Quasi-ZVS", IEEE Intl. Symposium on Circuits and Systems (ISCAS), (2017), 4 pgs.

\* cited by examiner

US 10,868,536 B1

HIGH COMMON-MODE TRANSIENT IMMUNITY HIGH VOLTAGE LEVEL SHIFTER

FIELD OF THE DISCLOSURE

This disclosure relates generally to power supply devices.

BACKGROUND

An electronic system can include circuitry having different supply voltages. The electronic system can have a core supply voltage for powering the circuitry, where the core supply voltage is kept low to conserve power. The circuitry, however, may require supply voltages higher than the core supply voltage. For example, one circuit component may need to drive another circuit component with a voltage level higher than the core supply voltage. In such applications, a level shifter can be implemented as an interface between the circuit components operating in different voltage domains, where the level shifter can shift a signal from one voltage level to another voltage level. For example, the level shifter can take an input signal from one circuit component having a first voltage domain that ranges from 0V to the core supply voltage and generate an output signal for another circuit component that has a second voltage domain ranging from 0V to a voltage higher than the core supply voltage.

SUMMARY OF THE DISCLOSURE

This disclosure is directed to, among other things, a high-voltage level shifter circuit that is capable of level shifting a signal from a low-voltage rail to a high-voltage rail for effective gate driving of a top power switch, with a short propagation delay and a high common-mode transient immunity (CMTI). The high CMTI high-voltage level shifter circuit can include a differential input and isolation stage, e.g., high-voltage laterally-diffused metal-oxide semiconductor (LDMOS), a high dv/dt sensor and cancellation stage, at least one differential and common-mode gain stage, and an output buffer stage.

In some aspects, this disclosure is directed to a level shifter circuit configured to receive an input signal in a first voltage domain by a differential input circuit and shift the input signal to a second voltage domain, the circuit comprising: a cancellation stage configured to reduce a common-mode current generated by a transition of the input signal from a first logic state to a second logic state; a gain stage coupled to the cancellation stage, wherein the gain stage is configured to receive both the differential-mode current and the reduced common-mode current, wherein the gain stage has a common-mode current gain of less than one; and an output stage configured to receive both the differential-mode current and the common-mode output current from the gain stage and generate a representation of the input signal shifted to the second voltage domain.

In some aspects, this disclosure is directed to a method of shifting an input signal in a first voltage domain to a second voltage domain, the method comprising: sensing a common-mode current generated by a transition of the input signal from a first logic state to a second logic state and generating a replica common-mode current; receiving the replica common-mode current and reducing a common-mode current to a gain stage; receiving, by the gain stage, the reduced common-mode current and generating a gain stage common-mode output current, wherein the gain stage has a common-mode current gain of less than one; and generating a representation of the input signal shifted to the second voltage domain.

In some aspects, this disclosure is directed to a level shifter circuit configured to receive an input signal in a first voltage domain by a differential input circuit and shift the input signal to a second voltage domain, the circuit comprising: means for sensing a common-mode current generated by a transition of the input signal from a first logic state to a second logic state and generating a replica common-mode current; means for receiving the replica common-mode current and reducing a common-mode current to a gain stage; means for receiving, by the gain stage, the reduced common-mode current and generating a gain stage common-mode output current, wherein the gain stage has a common-mode current gain of less than one; and an output stage configured to receive both the differential-mode current and the common-mode output current from the gain stage and generate a representation of the input signal shifted to the second voltage domain.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This disclosure describes a high-voltage level shifter circuit that is capable of level shifting a signal from a low-voltage rail to a high-voltage rail for effective gate driving of a top power switch, with a short propagation delay and a high common-mode transient immunity (CMTI). The high CMTI high-voltage level shifter circuit can include a differential input and isolation stage, e.g., high-voltage laterally-diffused metal-oxide semiconductor (LDMOS), a high dv/dt sensor and cancellation stage, at least one differential and common-mode gain stage, and an output buffer stage.

The high dv/dt sensor and cancellation stage can use a transistor identical to the transistor of the differential-input stage, e.g., LDMOS, to detect a dv/dt transient at a switching node and feedback the transient signal to reject the common-mode transient current at the two main level shifting differential paths and reduce common-mode gain.

Furthermore, the entire differential and common-mode gain stage as a whole can achieve unity differential gain, but less than one common-mode gain, e.g., one half. With a number N stages, the differential gain can remain at one while the common-mode gain becomes $1/2^N$. After the one or more gain stages, a signal can be shifted to a high-voltage rail, and a latch can store the logic state of the transition of the input signal from a first logic state, e.g., high, to a second logic state, e.g., low. The level-shifter circuit can achieve up to 100V/0.1 nanosecond (ns) (or 1 KV/ns equivalently) CMTI, nanosecond-level propagation delay and nearly-zero quiescent current at steady state for efficient and reliable gate driving, which makes it suited for gallium nitride (GaN) based switching power converter applications.

Figure 1:
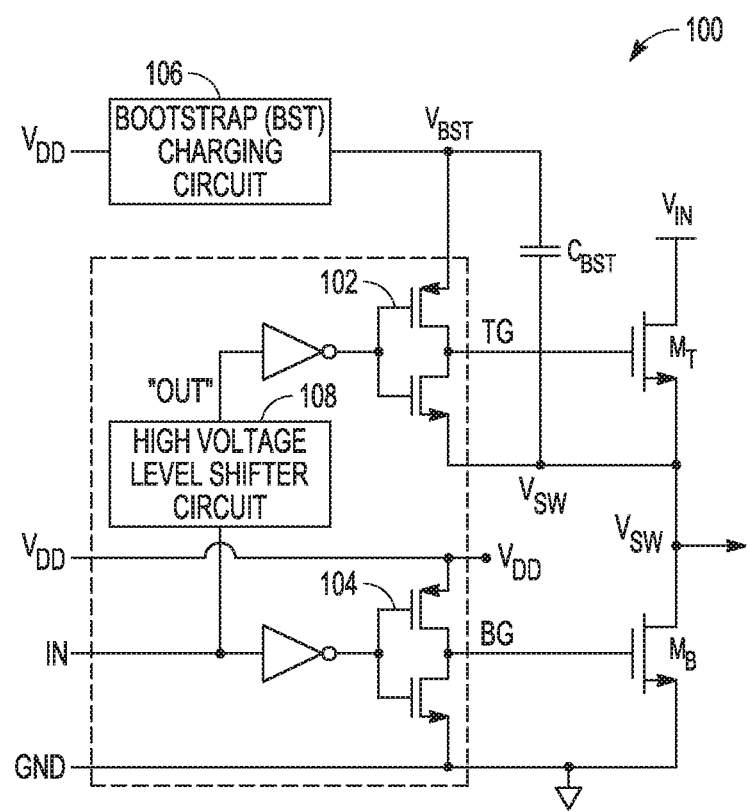
FIG. 1 is a schematic diagram of an example of system level circuit that includes a level shifter circuit.

FIG. 1 is a schematic diagram of an example of a system level circuit that includes a level shifter circuit. The system circuit 100 can include a top switch M r coupled to a top switch gate driver circuit 102 and a bottom switch $M_B$ coupled to a bottom switch gate driver circuit 104. The system circuit 100 can receive an input signal at the input IN at a first voltage domain, e.g., 0V (low) to 5V (high) and shift the signal, using the level shifter circuit 108, to a second voltage domain, e.g., 100V (low) to 105V (high), that includes the switching rail $V_{SW}$ and the boot-strap rail $V_{BST}$.

When the bottom switch $M_B$ is turned ON by the bottom switch gate driver circuit 104, the $V_{SW}$ voltage level is close to ground, and a bootstrap charging circuit 106 can charge the bootstrap capacitor $C_{BST}$ to maintain a constant voltage across $V_{BST}$ and $V_{SW}$. When the input signal changes from low to high, the signal can be transmitted by the level shifter circuit 108 and applied to the top switch gate driver circuit 102 to drive the top switch $M_T$ e.g., silicon field-effect transistor (FET).

As the input signal goes from low to high, the top gate node TG goes from low-to-high to turn ON the top switch $M_T$, and $V_{SW}$ rises at a high dv/dt rate. If using a gallium nitride FET (which shows much lower parasitic capacitances) as the top and bottom switches ($M_T$ and $M_B$), an even higher dv/dt occurs at $V_{SW}$, which can false trigger the level shifter and cause a wrong state at nodes OUT and TG. With a false trigger, the top switch $M_T$ could be on-off-on, with many incorrect output states, which can cause further failures of the power system.

Figure 2:
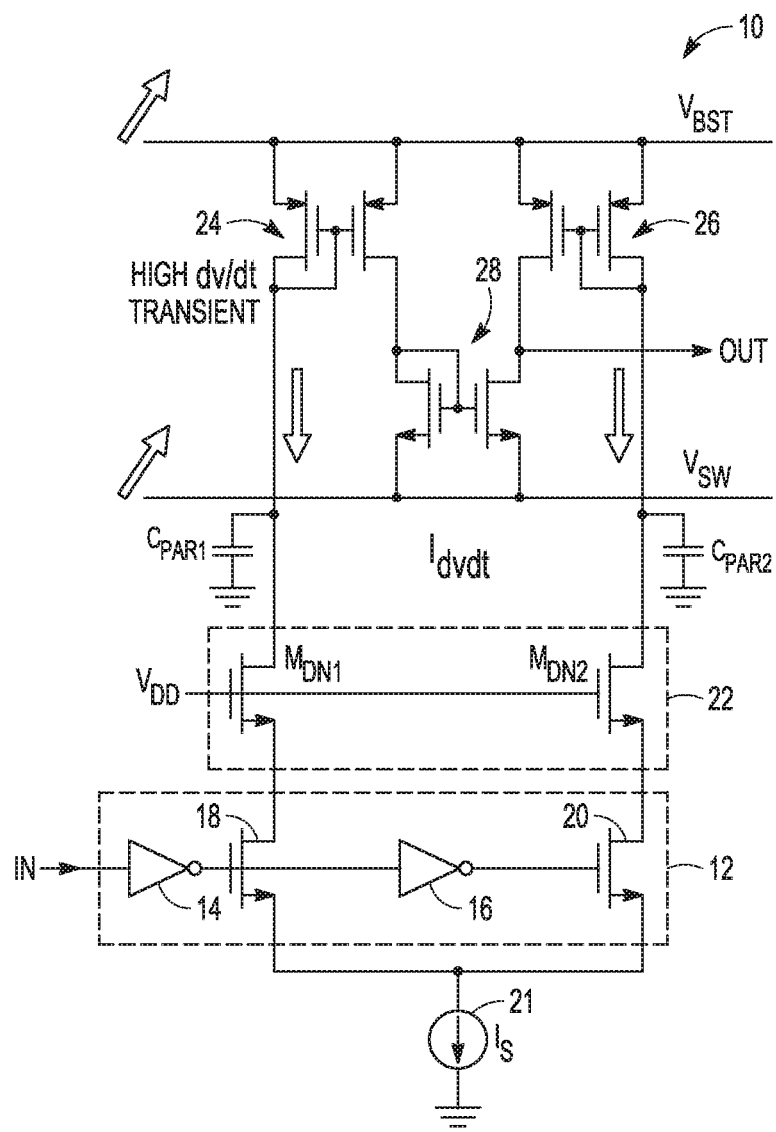
FIG. 2 is a simplified schematic diagram of an example of a mirror-based high-voltage level shifter circuit.

FIG. 2 is a simplified schematic diagram of an example of a mirror-based high-voltage level shifter circuit. The circuit 10 can include a low-voltage metal-oxide-semiconductor (MOS) differential input section 12 that can include first and second inverter circuits 14, 16 and first and second transistors 18, 20. A current source 21 generating a current $I_S$ can be coupled to the first and second transistors 18, 20 and can provide a tail current. The circuit 10 can further include a high-voltage double-diffused MOS (DMOS) section 22 including transistors $M_{DN1}$ and $M_{DN2}$, which can be coupled to the first and second transistors 18, 20, respectively. Three current mirrors are shown at 24-28. The low voltage MOS section 12 can receive an input signal at the input IN at a first voltage domain, e.g., 0V (low) to 5V (high), and shift the signal to a second voltage domain, e.g., 100V (low) to 105V (high), that includes the switching rail $V_{SW}$ and the boot-strap rail $V_{BST}$.

In the example of FIG. 2, the high-voltage DMOS transistors $M_{DN1}$ and $M_{DN2}$ can provide high-voltage isolation, while the differential input structure supports a low dv/dt immunity. Under high dv/dt transients at rail $V_{SW}$, the parasitic capacitances $C_{PAR1}$, $C_{PAR2}$ can trigger high dv/dt current $I_{DVDT}$ at the two respective paths shown. Due to a mismatch of the parasitic capacitances and current mirrors, the high dv/dt current $I_{DVDT}$ can cause a false trigger of the output signal at OUT. In addition, the level shifter circuit 10 can consume a static current of $I_S$.

Figure 3:
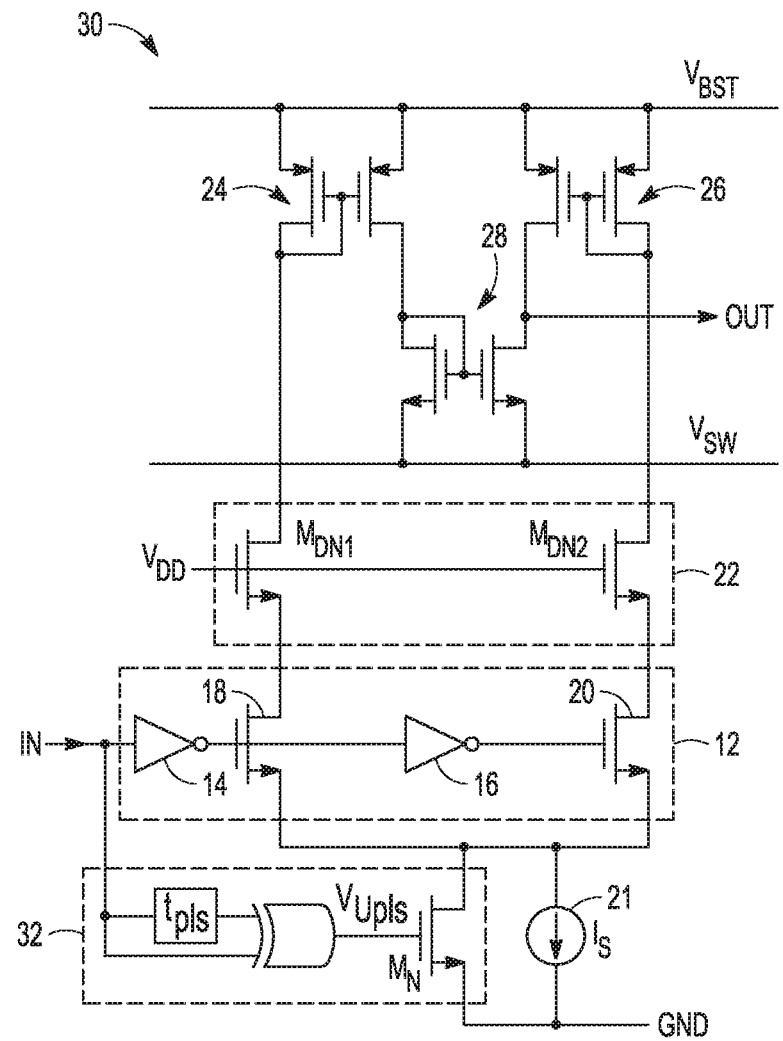
FIG. 3 is a simplified schematic diagram of another example of a mirror-based high-voltage level shifter circuit.

FIG. 3 is a simplified schematic diagram of another example of a mirror-based high-voltage level shifter circuit. The circuit 30 of FIG. 3 can include at least some components that are similar to those shown in FIG. 3, which for purposes of conciseness, will not be described in detail again.

The circuit 30 can include a pulse generator circuit 32 coupled to the differential input circuit and configured to reduce a propagation delay of the level shifter circuit. To reduce the propagation delay of the level shifter circuit, the pulse generator circuit can generate a pulse, e.g., 2-6 ns pulse, that can dramatically increase the tail current for a high slew rate during signal transition. In this manner, the parasitic capacitances $C_{PAR1}$, $C_{PAR2}$ (shown in FIG. 2) can be quickly charged or discharged. However, the rail $V_{SW}$ can ring after pulse expires and the dv/dt immunity can remain low, similar to the circuit 10 in FIG. 2. In addition, the level shifter circuit 30 can consume a static current of $I_S$.

Figure 4:
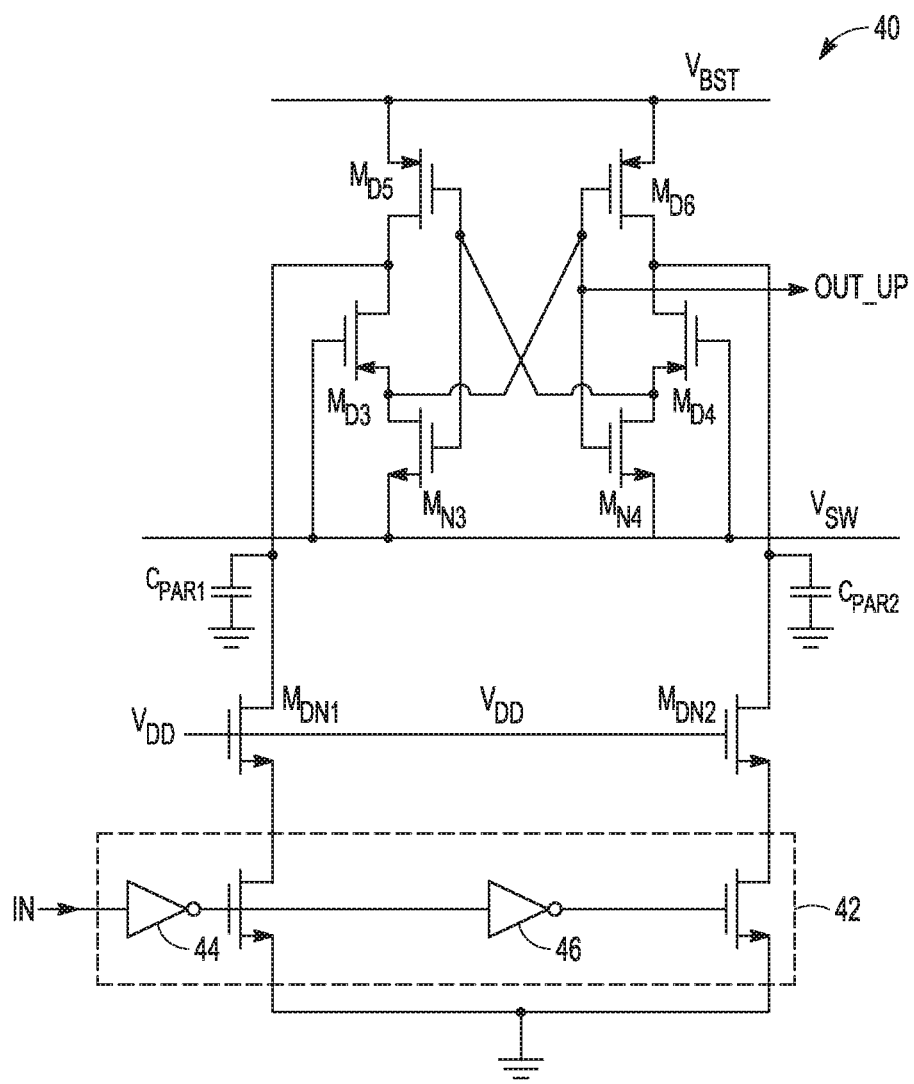
FIG. 4 is a simplified schematic diagram of an example of a latch-based high-voltage level shifter circuit.

FIG. 4 is a simplified schematic diagram of an example of a latch-based high-voltage level shifter circuit. The circuit 40 can include a differential input section 42 that can include first and second inverter circuits 44, 46 and first and second transistors $M_{N1}$, $M_{N2}$. The circuit 40 can further include transistors $M_{D1}$ and $M_{D2}$, which can be coupled to the first and second transistors $M_{N1}$, $M_{N2}$. The six transistors $M_{N3}$, $M_{N4}$, and $M_{D3}$-$M_{D6}$ can form a latch.

The level shift circuit 40 of FIG. 4 can consume nearly zero static current in steady state. However, it can include six or more high-voltage DMOS transistors ($M_{D1}$-$M_{D6}$) and can have a large footprint, especially at voltages of 100V or higher. On the other hand, during high dv/dt transition at rail $V_{SW}$, the parasitic capacitance $C_{PAR1}$, $C_{PAR2}$ at the drains of $M_{D1}$ and $M_{D2}$ can trigger two respective high dv/dt currents. These dv/dt currents can reset the state of the latch, which can lead to a false-trigger of output state. To provide high dv/dt immunity, the latch device sizes (including transistors $M_{N3}$, $M_{N4}$, and $M_{D3}$-$M_{D6}$) can be large to increase the strength of the latch. However, it can take a large die size and a high instant current to transmit the level-shifting signals, leading to a long propagation delay.

To address the challenges described above, this disclosure describes a high common-mode transient immunity (CMTI) high voltage level shifter circuit that is capable of level shifting a signal from a low-voltage rail to a high-voltage rail under a high common mode transient (dv/dt) at rail $V_{SW}$, and with sub-nanosecond propagation delay.

Figure 5:
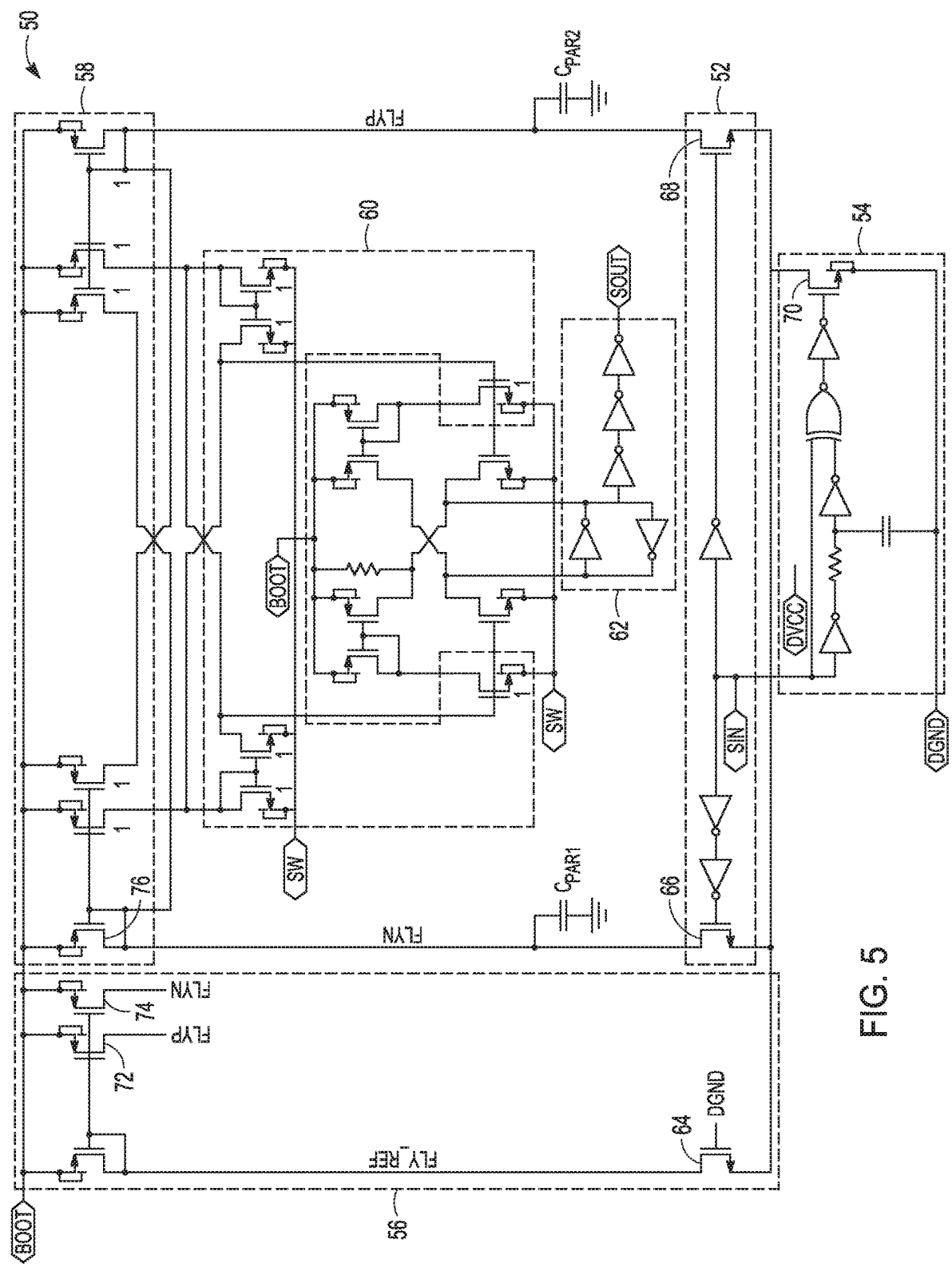
FIG. 5 is a schematic diagram of an example of a high-voltage level shifter circuit using various techniques of this disclosure.

FIG. 5 is a schematic diagram of an example of a high-voltage level shifter circuit using various techniques of this disclosure. The level shifter circuit 50 of FIG. 5 can include a differential input and isolation stage 52, e.g., high-voltage LDMOS-based, a pulse generator circuit 54 for slew rate enhancement, a dv/dt sensor and cancellation stage circuit 56, a first gain stage circuit 58, e.g., transistor-based, coupled to the dv/dt sensor and cancellation stage circuit 56, a second gain stage circuit 60, e.g., transistor-based, coupled to the first gain stage circuit 58, and an output buffer stage circuit 62.

In some example configurations, the first gain stage circuit 58 can include P-type (or N-type) field-effect transistors (FETs) and the second gain stage circuit 60 can include N-type (or P-type) FETs. As described below in more detail with respect to FIG. 6, in some examples, the first gain stage circuit 58 can include a first common-mode gain stage and a first differential-mode gain stage, which can handle the common-mode current and differential-mode current differently. Similarly, in some examples, the second gain stage circuit 60 can include a second common-mode gain stage and second differential-mode gain stage.

The dv/dt sensor and cancellation stage circuit 56 can be configured to reduce a common-mode current generated by a transition of the input signal from a first logic state, e.g., low, to a second logic state, e.g., high. The dv/dt sensor and cancellation stage circuit 56 can include a "dummy" transistor 64, e.g., LDMOS, that is the same size as the transistors 66, 68 of the differential input and isolation stage 52. An input signal can be received at node SIN and a corresponding level-shifted output signal can be output at node SOUT.

During an input signal transition from a first logic state to a second logic stage, a pulse, e.g., a 2-ns pulse, can be generated at the gate terminal of the transistor 70, e.g., NMOS transistor, that is coupled to the source terminals of the transistors 66, 68 of the input and isolation stage circuit 52. The pulse can generate a high tail current to transmit the differential-mode signal effectively and with a short propagation delay.

During a high dv/dt transient on the bootstrap ("BOOT") and switch ("SW") rails, a high dv/dt common-mode current can be generated through the drain path of the transistors 66, 68, e.g., LDMOS-based transistors, of the differential input and isolation stage 52. The dv/dt sensor and cancellation stage circuit 56 can include a high-voltage transistor 64, which is the same size as the transistors 66, 68 of the two main level shifting differential paths and will have a similar parasitic capacitance at its drain terminal. The dv/dt sensor and cancellation stage circuit 56 can sense a common-mode current generated by a transition of the input signal from a first logic state to a second logic state and generate a replica common-mode current.

During a dv/dt transient, where the bootstrap ("BOOT") and switch ("SW") rails go high, the parasitic capacitance $C_{PAR1}$, $C_{PAR2}$ associated with the drain terminal of the transistor 64 will charge up via a current through node FLY_REF, which can be considered a replica common-mode current. The replica common-mode current through the transistor 64 can be mirrored by the current mirror formed by the transistors 72, 74. The transistors 72, 74 are coupled to nodes FLYP and FLYN, respectively, and those nodes receive the replica common-mode current and reduce the common-mode current to the gain stage 58. The current fed into nodes FLYP and FLYN by the dv/dt sensor and cancellation stage circuit 56 charges up the parasitic capacitances $C_{PAR1}$, $C_{PAR2}$ associated with the drain terminals of the transistors 66, 68. Charging up the parasitic capacitances can reduce (or cancel) the common-mode current through the transistors 66, 68, which can reduce (or cancel) the common-mode current in the gain stage circuit 58.

In this manner, by using the dv/dt sensor and cancellation stage circuit 56, which has transistor 64 sized the same as the transistors 66, 68 of the differential input and isolation stage 52, the same amount of dv/dt current can be generated by the dv/dt sensor and cancellation stage circuit 56 and fed to the two main level shifting differential paths and reduce or cancel the dv/dt triggered common-mode current.

However, due to potential mismatches and delays of the current mirrors of the gain stages, the dv/dt triggered current may not be fully cancelled. A gain stage, such as the first gain stage 58 (and the second gain stage 60 and more, if present) can play an important role in rejecting the common-mode signal while effectively transmitting the differential signal. The gain stage 58 can be coupled to the cancellation stage 56 and can be configured to receive a reduced common-mode current from the cancellation stage and a differential-mode current. The gain stage 58 can have a common-mode current gain of less than one. In some examples, the differential current gain through the first gain stage 58 and the second gain stage can be at least one.

The output stage circuit 62 can be configured to receive both the differential-mode current and the common-mode output current from the gain stage and generate a representation of the input signal shifted to the second voltage domain. In some examples, the output stage can include a latch circuit configured to store the second logic state of the input signal to reflect the input state, e.g., after the input signal transitions from a first logic state to a second logic state.

Figure 6:
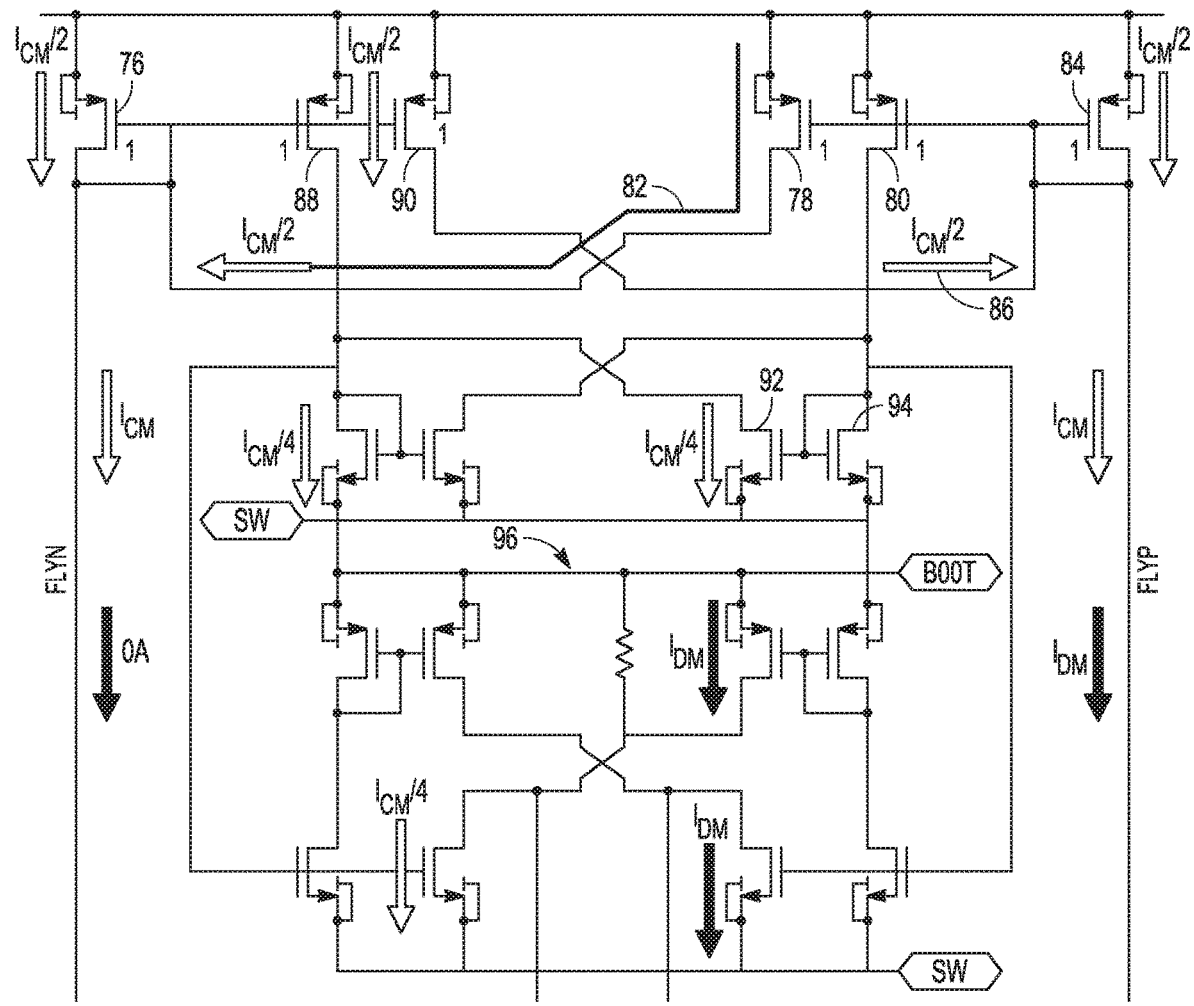
FIG. 6 is a schematic diagram of a portion of the circuit of FIG. 6 illustrating the rejection of the common-mode signal while effectively transmitting the differential signal.

In the example configuration shown in FIG. 5, the first and second gains stages can include cross-coupled mirror circuits with a 1:1:1 ratio in each branch. Due to the cross-coupled structure with 1:1:1 ratio in each branch, the common-mode current gain can become one-half after the first gain stage 58 and can be further reduced to one-quarter after the second gain stage 68, as shown in FIG. 6. The configuration shown in FIG. 5 is a non-limiting example configuration. In other configurations, the current gain of the first stage 58 can be greater than or less than one-half, and the current gain of the second stage 60 can be greater than or less than one-half.

FIG. 6 is a schematic diagram of a portion of the circuit of FIG. 5 illustrating the rejection of the common-mode signal while effectively transmitting the differential signal. As seen in FIG. 6, the common-mode current $I_{CM}$ through node FLYN (left-hand side of FIG. 6) is formed from the sum of the common-mode current $I_{CM}/2$ through transistor 76 and the common-mode current $I_{CM}/2$ through path 82 via the current mirror formed by transistor 78. Similarly, the common-mode current $I_{CM}$ through node FLYP (right-hand side of FIG. 6) is formed from the sum of the common-mode current $I_{CM}/2$ through transistor 84 and the common-mode current $I_{CM}/2$ through path 86 via the current mirror formed by transistor 90.

The cross-coupled mirror circuits with 1:1:1 ratio in the left-hand branch of the first gain stage circuit (shown at 58 in FIG. 5) can generate a common-mode current of $I_{CM}/2$ through the current mirror formed by transistors 88, 90. The cross-coupled structure with 1:1:1 ratio in the second gain stage circuit (shown at 60 in FIG. 5) can further reduce the common-mode current. In particular, the common-mode current of $I_{CM}/2$ splits between the left-hand branch and the right-hand branch of the second gain stage circuit, resulting in a common-mode current of $I_{CM}/4$ through each branch. In this manner, the common-mode current can be halved, for example, after each cross-coupled stage, from $I_{CM}$ to $I_{CM}/2$ to $I_{CM}/4$, for the non-limiting example configuration shown in FIGS. 4 and 5. In other examples, the common-mode current gain of the first gain stage or the second gain stage can be greater than or less than one-half.

As seen in FIG. 6, the differential signal is OA through the node FLYN (left-hand side) and $I_{DM}$ through the node FLYP (right-hand side). Because there is no differential-mode current through the transistor 76 (left-hand side of FIG. 6), there is no differential-mode current flowing through the current mirror formed by transistors 88, 90 and thus no cancellation of the differential-mode current DM via cross-coupling in the way that the common-mode current was canceled. Instead, the differential-mode current $I_{DM}$ through the transistor 84 can be mirrored in a 1:1:1 ratio with the current mirror formed by transistors 78, 80 and outputted to the second gain stage circuit (shown at 60 in FIG. 5) with a gain of one or more, for example. The second gain stage circuit can receive the differential-mode signal $I_{DM}$ via the current mirror formed by the transistors 92, 94 and output a differential-mode signal with a gain of at least one, for example.

For the differential signal $I_{DM}$, the differential gain of the circuit shown in FIGS. 4 and 5 can be one (or more) because the differential current $I_{DM}$ (the input signal) is fully mirrored without degrading. The pull-up and pull-down capability are both $I_{DM}$ at the last stage, which can fully transmit the input signal transitions.

By way of a non-limiting specific example, the differential-mode input current can be 2 mA, while the dv/dt common-mode current under 100V/ns can be about 6 mA (depending on the size of transistor and its parasitic capacitance). After dv/dt cancellation, the remaining dv/dt triggered common-mode current can be about 1 mA. After that, the remaining common-mode current of 1 mA can be further reduced to 0.25 mA after two differential-mode and common-mode gain stages, as described above.

Advantageously, however, the differential-mode current can remain unchanged at 2 mA, which can help to effectively level-shift the signals and prevent false triggers. The common-mode current can be reduced to nearly zero in last stage (the cross-coupled stage 96 after the second gain stage), while the unity-gain differential-mode current can trigger the latch to transmit the input signal to the output. In this way, the input signal in the low-voltage rail can be effectively shifted to the high-voltage rails, while the high dv/dt common-mode transient is substantially rejected. Moreover, nearly zero static current is needed in steady state to save power.

Moreover, to achieve even high dv/dt transient up to 100/0. 1ns or 1 KV/ns, additional gain stages can be constructed to further reduce the common-mode current gain to $1/2^N$, where N is the stage number. However, additional stages can result in additional propagation delay.

The high CMTI high-voltage level shifter circuit described above disclosure has several advantages. With the cross-coupled structure, the overall differential gain of the input signal is "1", while the common mode gain is $1/2^N$, where N is the number of gain stages. The techniques described can help to effectively transmit a signal from a low-voltage domain to a high-voltage domain with short propagation delay and reject the high dv/dt transient of the common-mode signal.

In some example configurations, the high dv/dt sensor and cancellation circuit (shown at 56 in FIG. 5) can use a transistor identical to the input differential input transistor to detect a dv/dt transient at the switching node and feedback the transient to reject the common-mode transient current at the two main level shifting differential paths and reduce common-mode gain.

In addition, the input low-voltage signal can be shifted to high-voltage rail, further triggering the latch circuit (shown at 62 in FIG. 5) to store the state. It can achieve 100V/0.1 ns CMTI (or more) and can achieve nanosecond-level propagation delay, and consume zero quiescent current in steady state.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A level shifter circuit configured to receive an input signal in a first voltage domain by a differential input circuit and shift the input signal to a second voltage domain, the circuit comprising:
 a cancellation stage configured to:
  sense a first common-mode current generated in response to a transition of a switching node from a first voltage level to a second voltage level, wherein the transition of the switching node is caused by a transition of the input signal; and
  generate a second common-mode current that, when combined with the first common-mode current, produce a reduced common-mode current;
 a gain stage coupled to the cancellation stage, wherein the gain stage is configured to receive both a differential-mode current and the reduced common-mode current during the transition of the switching node, wherein the gain stage has a common-mode current gain of less than one, and wherein the gain stage includes a pair of cross-coupled current mirror circuits; and
 an output stage configured to receive both the differential-mode current and the common-mode output current from the gain stage and generate a representation of the input signal shifted to the second voltage domain.

2. The level shifter circuit of claim 1, wherein the output stage includes a latch circuit configured to store the second logic state of the input signal.

3. The level shifter circuit of claim 1, wherein the gain stage has a differential-mode current gain of at least one.

4. The level shifter circuit of claim 1, wherein the gain stage is a first gain stage, wherein the common-mode current gain is a first common-mode current gain, the level shifter circuit further comprising:
 a second gain stage coupled to an output of the first gain stage, wherein the second gain stage has a second common-mode current gain of less than one.

5. The level shifter circuit of claim 4, wherein the first common-mode current gain is one-half, and wherein the second common-mode current gain is one-half.

6. The level shifter circuit of claim 4, wherein the first gain stage includes a first common-mode gain stage and first differential-mode gain stage, and the second gain stage includes a second common-mode gain stage and second differential-mode gain stage.

7. The level shifter circuit of claim 1, wherein the gain stage is a first gain stage of a number of N gain stages, wherein individual ones of the N gain stages have corresponding common-mode current gains of less than one.

8. The level shifter circuit of claim 7, wherein the common-mode gain of at least one of the N gain stages is $1/2^N$.

9. The level shifter circuit of claim 8, wherein the differential-mode current gain is at least one.

10. The level shifter circuit of claim 1, further comprising:
 a pulse generator circuit coupled to the differential input circuit to reduce a propagation delay of the level shifter circuit.

11. A method of shifting an input signal in a first voltage domain to a second voltage domain, the method comprising:
 sensing a first common-mode current generated in response to a transition of a switching node from a first voltage level to a second voltage level, wherein the transition of the switching node is caused by a transition of the input signal and generating a replica common-mode current;
 receiving the replica common-mode current and combining with the first common-mode current to produce a reduced common-mode current to a gain stage, wherein the gain stage includes a pair of cross-coupled current mirror circuits;
 receiving, by the gain stage, both a differential-mode current and the reduced common-mode current during the transition of the switching node and generating a gain stage common-mode output current, wherein the gain stage has a common-mode current gain of less than one; and
 generating a representation of the input signal shifted to the second voltage domain.

12. The method of claim 11, further comprising:
 storing the second logic state the of input signal.

13. The method of claim 11, further comprising:
 generating a gain stage differential output current, wherein the gain stage has a differential current gain of at least one.

14. The method of claim 11, wherein the gain stage is a first gain stage, wherein the gain stage common-mode output current is a first gain stage common-mode output current, and wherein the common-mode current gain is a first common-mode current gain, the method further comprising:
 receiving, by a second gain stage, the first gain stage common-mode output current and generating a second gain stage common-mode output current, wherein the second gain stage has a second common-mode current gain of less than one.

15. The method of claim 14, wherein the first common-mode current gain is one-half, and wherein the second common-mode current gain is one-half.

16. The method of claim 11, further comprising:
 generating a pulse to increase a tail current to reduce a propagation delay of the level shifter circuit.

17. A level shifter circuit configured to receive an input signal in a first voltage domain by a differential input circuit and shift the input signal to a second voltage domain, the circuit comprising:
 means for sensing a first common-mode current generated in response to a transition of a switching node from a first voltage level to a second voltage level and generating a replica common-mode current;
 means for receiving the replica common-mode current and combining with the first common-mode current to produce a reduced common-mode current to a gain stage;
 means for receiving, by the gain stage, both a differential-mode current and the reduced common-mode current during the transition of the switching node and generating a gain stage common-mode output current, wherein the gain stage has a common-mode current gain of less than one, and wherein the gain stage includes a pair of cross-coupled current mirror circuits; and
 an output stage configured to receive both the differential-mode current and the common-mode output current from the gain stage and generate a representation of the input signal shifted to the second voltage domain.

18. The level shifter circuit of claim 17, wherein the output stage includes a latch circuit configured to store the second logic state the of input signal.

19. The level shifter circuit of claim 17, wherein the gain stage has a differential-mode current gain of at least one.

20. The level shifter circuit of claim 17, wherein the gain stage is a first gain stage, wherein the common-mode current gain is a first common-mode current gain, the level shifter circuit further comprising:
  a second gain stage coupled to an output of the first gain stage, wherein the second gain stage has a second common-mode current gain of less than one.

21. The level shifter circuit of claim 20, wherein the first common-mode current gain is one-half, and wherein the second common-mode current gain is one-half.

\* \* \* \* \*